US006227915B1

(12) United States Patent
Sakatani et al.

(10) Patent No.: US 6,227,915 B1
(45) Date of Patent: May 8, 2001

(54) FEMALE TERMINAL FITTING

(75) Inventors: Atsushi Sakatani; Shinya Fujita, both of Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/525,290

(22) Filed: Mar. 15, 2000

(30) Foreign Application Priority Data

Mar. 16, 1999 (JP) ................................................ 11-069998
Apr. 5, 1999 (JP) ................................................ 11-097773

(51) Int. Cl.[7] .............................. H01R 12/00; H05K 1/00
(52) U.S. Cl. ........................................ 439/852; 439/752.5
(58) Field of Search .............................. 439/79, 851, 852

(56) References Cited

U.S. PATENT DOCUMENTS 5,593,328 * 1/1997 Okada et al. ........................ 439/851
5,769,673 * 6/1998 Ohta et al. .......................... 439/852
5,788,542 * 8/1998 Miwa .................................. 439/851

FOREIGN PATENT DOCUMENTS 2 335 802 9/1999 (GB) .
11-307160 11/1999 (JP) .

* cited by examiner

*Primary Examiner*—Neil Abrams
*Assistant Examiner*—Michael C. Zarroli
(74) *Attorney, Agent, or Firm*—Anthony J. Casella; Gerald E. Hespos; Michael J. Porco

(57) ABSTRACT

A female terminal fitting is provided with protection walls 16 to avoid interference of a male terminal fitting M and to guide the male terminal fitting M to a proper position even if it is obliquely inserted. A tongue 9 is provided at or on the bottom surface of a connecting portion 3 of a female terminal fitting F by being turned inwardly so as to be elastically deformable. Protection walls 16 project from side edges of an opening end of the connecting portion 3 in such a manner as to be opposed to each other. Slanting guide surfaces 17 extending away from each other at upper ends of the protection walls 16. When a male terminal fitting M that is inserted obliquely, is slid upward along the guide surfaces to be guided automatically to a proper position.

6 Claims, 6 Drawing Sheets

FEMALE TERMINAL FITTING

BACKGROUND OF THE INVENTION

1. Field of the Invention

The present invention relates to a female terminal fitting.

2. Description of the Related Art

A prior art female terminal fitting is identified generally by the numeral 20 in FIG. 6. The prior art female terminal fitting 20 includes a connecting portion 21 for the connection with a male terminal fitting. The connecting portion 21 is formed at a front part of a female terminal fitting 20 bat bending, and is normally in the form of a rectangular tube extending in forward and backward directions. Further, a tongue 22 is provided at or on the bottom surface of the connecting portion 21, and can be brought elastically into contact with a tab of the male terminal fitting. The tongue 22 is formed by turning the bottom wall of the connecting portion 21 inwardly at the front end to have a substantially U-shape. The tongue 22 undergoes an elastic deformation and exerts a specified spring force to hold the tab of the male terminal fitting tightly against the ceiling surface of the connecting portion 21. Accordingly, it is essential to avoid excessive deformation of the tongue 22 in order to ensure a satisfactory electrical connection with the male terminal fitting. However, when a jig with a tapered leading end is inserted to withdraw the female terminal fitting 20 from the connector housing, it may mistakenly strike against the tongue 22. To avoid such an event, a protection wall 23 conventionally has been provided in front of the turned portion of the tongue 22.

There are some cases where the center axis of the tab of the male terminal fitting is displaced with respect to the female terminal fitting when the male and female connector housings are connected. In such cases, the tab may be deformed by interference with the above-mentioned protection wall 23.

The present invention was developed in view of the above problem, and an object thereof is to provide a female terminal fitting which can guide a male terminal fitting to a proper position by avoiding interference with a protection wall even if the center axis of a male terminal fitting is slightly displaced from the female terminal fitting.

SUMMARY OF THE INVENTION

According to the invention, a female terminal fitting is formed at its front with a connecting portion into which a male terminal fitting can be inserted. A tongue is formed at or on a first or bottom surface of the connecting portion, and can be brought elastically into contact with a tab of the male terminal fitting. At least ones protection wall projects from the connecting portion and substantially covers the front end of a portion of the tongue. At least one guide surface is provided at the protection wall and comes into sliding contact with the male terminal fitting. The guide surface is tapered across its width to guide the male terminal fitting to a proper contact position with the tongue.

According to a preferred embodiment of the invention, the connecting portion is in the form of a substantially rectangular tube.

The tongue portion may be formed at or on the first or bottom surface of the connecting portion by being elastically deformed and turned into the connecting portion. The protection wall preferably projects from the connecting portion and covers the front end of the turned portion of the tongue. More particularly, the protection wall preferably projects from an opening end of the connecting portion.

The guide surface preferably is provided for sliding contact with a guide portion formed at the leading end of the male terminal. Two guide surfaces preferably are formed on opposed ends of two protection walls.

Most preferably, the female terminal fitting is formed by bending an integral or unitary electrically conductive metal plate.

According to a further preferred embodiment, a female terminal fitting is formed by bending an electrically conductive metal plate. A front part of the female terminal fitting is formed with a connecting portion in the form of a rectangular tube into which a male terminal fitting can be inserted. A tongue is formed at or on the bottom surface of the connecting portion by elastically deforming the connecting portion inwardly so that it can be elastically brought into contact with a tab of the male terminal fitting. A pair of protection walls project from an opening end of the connecting portion and cover the front end of the turned portion of the tongue. Guide surfaces are formed at the opposed ends of the protection walls, and function to guide the male terminal fitting to a proper contact position with the tongue.

Accordingly, if the central axis of the male terminal fitting is not displaced when the male terminal fitting is inserted into the connecting portion, the male terminal fitting is inserted to a proper position in the connecting portion after passing the protection walls and is brought elastically into contact with the tongue. However, if the central axis of the male terminal fitting is displaced, the side edges of the guide portion of the male terminal fitting come into contact with the guide surfaces. In response to further insertion, the male terminal fitting is slid along the guide surface and guided to the proper position. Thus, the male terminal fitting can be guided to the proper position in the connecting portion by having a displacement of its central axis corrected.

Preferably, the pair of protection walls project from the opposite sides of the opening end of the connecting portion and the guide surfaces are formed by cutting the opposed ends of the protection walls such that a spacing therebetween is widened toward the top or to a tab insertion space of the connection portion.

Accordingly, the pair of protection walls that have the above function can be formed easily by bending the side ends of the opening end of the connecting portion.

Most preferably, one or more stoppers are formed in one or more walls of the connecting portion and are located substantially below a contact portion of the tongue with the male terminal fitting.

These and other objects, features and advantages of the present invention will become more apparent upon a reading of the following detailed description and accompanying drawings.

DETAILED DESCRIPTION OF THE PREFERRED EMBODIMENT

Figure 1:
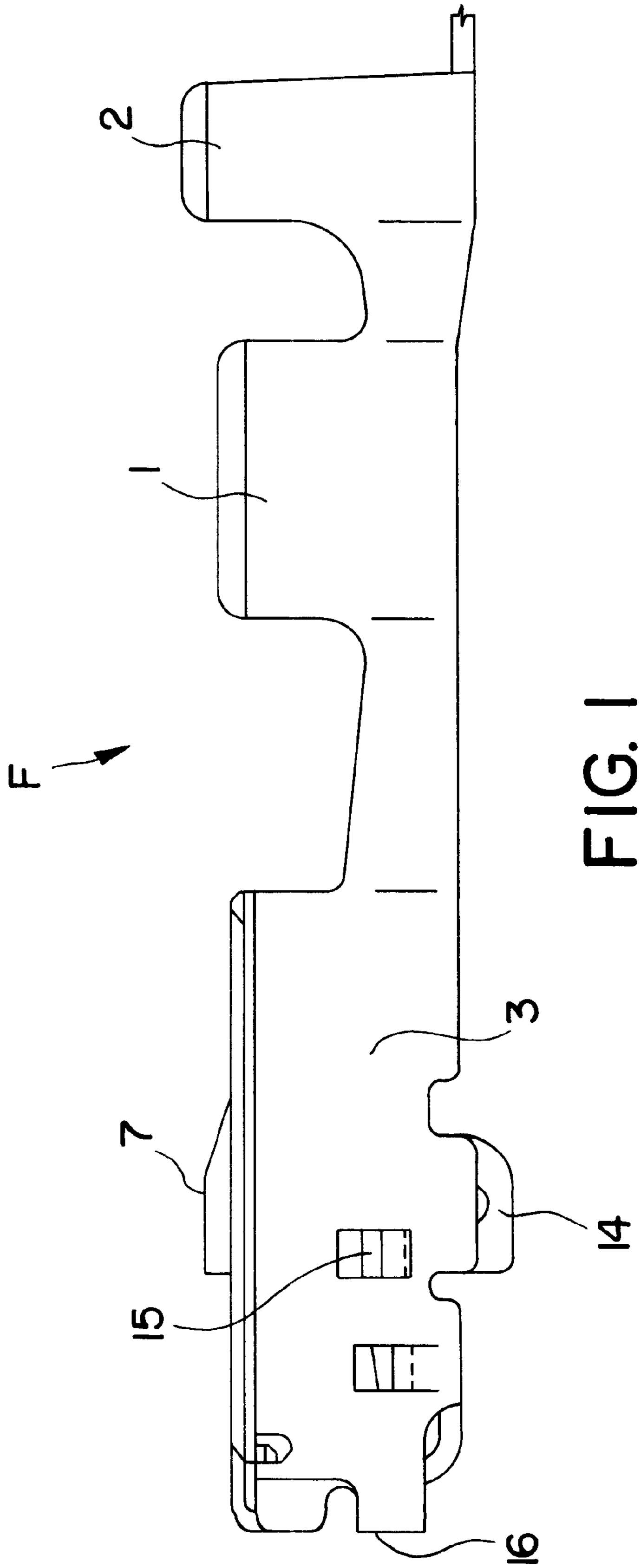
FIG. 1 is a side view of a female terminal fitting.
Figure 2:
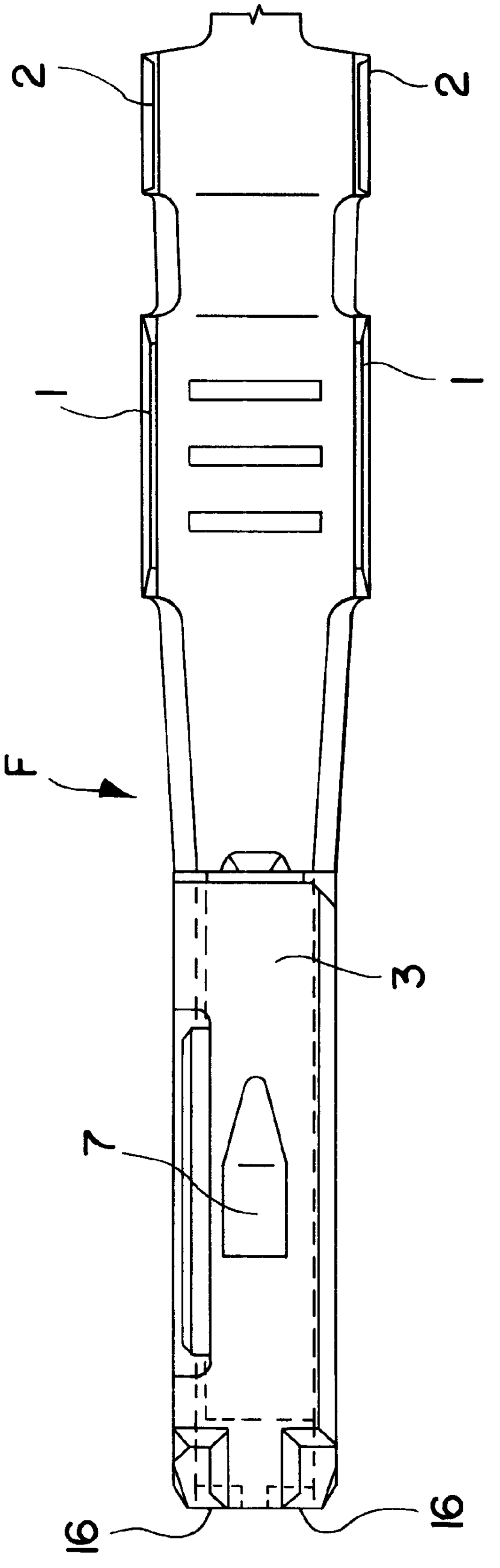
FIG. 2 is a plan view of the female terminal fitting.
Figure 3:
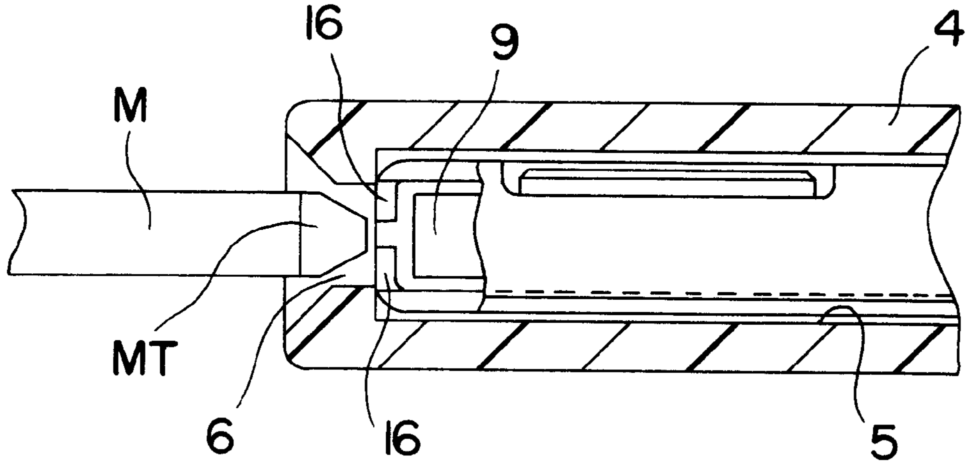
FIG. 3 is plan view in section of the female terminal fitting when being accommodated in a connector housing.

A female terminal fitting, in accordance with the invention, is identified by the letter F in FIGS. 1–5. The female terminal fitting F is integrally or unitarily formed by bending an electrically conductive metal plate and is provided at its rear with a pair of wire barrels 1 for fastening to a core of a wire and a pair of insulation barrels 2 for fastening to an insulation coating of the wire. On the other hand, a connecting portion 3 is formed at the front of the female terminal fitting for connection with a male terminal fitting M. The connecting portion 3 preferably is in the form of a substantially rectangular tube extending in longitudinal or forward and backward direction. The front end of the connecting portion 3 contacts the front wall of a cavity 5 of a connector housing 4 when the female terminal fitting F is inserted into the cavity 5, thereby specifying the position of the female terminal fitting F with respect to the forward direction or the insertion direction of the female terminal F into the connector housing 4. When the male terminal fitting M is accommodated in the cavity 5, the front end surface of the connecting portion 3 communicates with a terminal receiving opening 6 which is open in the front surface of the cavity 5. It should be noted that the leading end of the male terminal fitting M preferably is tapered to form a guide portion MT, as shown in FIG. 3.

A projection 7 is formed substantially in the center of the upper surface of the connecting portion 3. The projection 7 fits into an escape groove 8 formed in the ceiling wall of the cavity 5 along the longitudinal direction. Since no such escape groove 8 is formed in the bottom or opposing surface of the cavity 5, the female terminal fitting F is prevented from being mistakenly inserted upside-down.

On the other hand, a tongue 9 is provided at the bottom surface of the connecting portion 3. When the male terminal fitting M is inserted correctly into a tab insertion space 10 between the ceiling and bottom surfaces of the connecting portion 3, the leading end of the male terminal fitting M is brought electrically into contact with the tongue 9, and is held tightly between the bottom and ceiling surfaces. The tongue 9 preferably is formed by turning the leading end of the bottom wall of the connecting portion 3 upward to substantially have a U-shape. More specifically, the turned portion is located slightly backward from the front end surface of the connecting portion 3. Further, the tongue 9 has a substantially triangular cross section projecting upward or toward the tab insertion space 10 when taken along an insertion direction of the male terminal fitting M, and its apex projects upward or toward the tab insertion space 10 to serve as a contact portion 9A. A free end of the tongue 9 preferably is substantially in contact with a receiving portion 11, which is formed e.g. by stamping or deforming or bending the bottom wall of the connecting portion 3. This contact portion of the free end with the portion 11 is slightly bent upward so as not to forcibly touch the receiving portion 11. Therefore, the tongue 9 smoothly undergoes an elastic deformation when the male terminal fitting M is inserted.

A substantially rectangular locking hole 13 is formed in the bottom wall of the connecting portion 3 substantially over its entire width, and can be engaged with an elastically deformable locking portion 12. The locking hole 13 is formed by cutting the bottom wall open between the opposite sidewalls. The cut is configured so that one sidewall projects down further than the other sidewall to define a stabilizer 14 that extends downward continuously from the one side wall of the connecting portion 3. The stabilizer 14 can be slid along a groove formed in the bottom surface of the cavity 5 along longitudinal direction, and fulfils an upside-down insertion preventing function similar to the above-mentioned projection 7.

Two stoppers 15 are provided at the respective opposite sidewalls of the connecting portion 3 for contacting the tongue 9 and restricting an excessive elastic deformation of the tongue 9. The stoppers 15 are formed, for example, by making cuts in the sidewalls of the connecting portion 3 and bending the cut portions inwardly. Additionally, the stoppers 15 are located substantially below the contact portion 9A of the tongue 9. It should be noted that the tongue 9 and the stoppers 15 are not brought into contact with each other when the tongue 9 is deformed upon the insertion of the male terminal fitting M so as not to impair the elasticity of the tongue 9.

Figure 5:
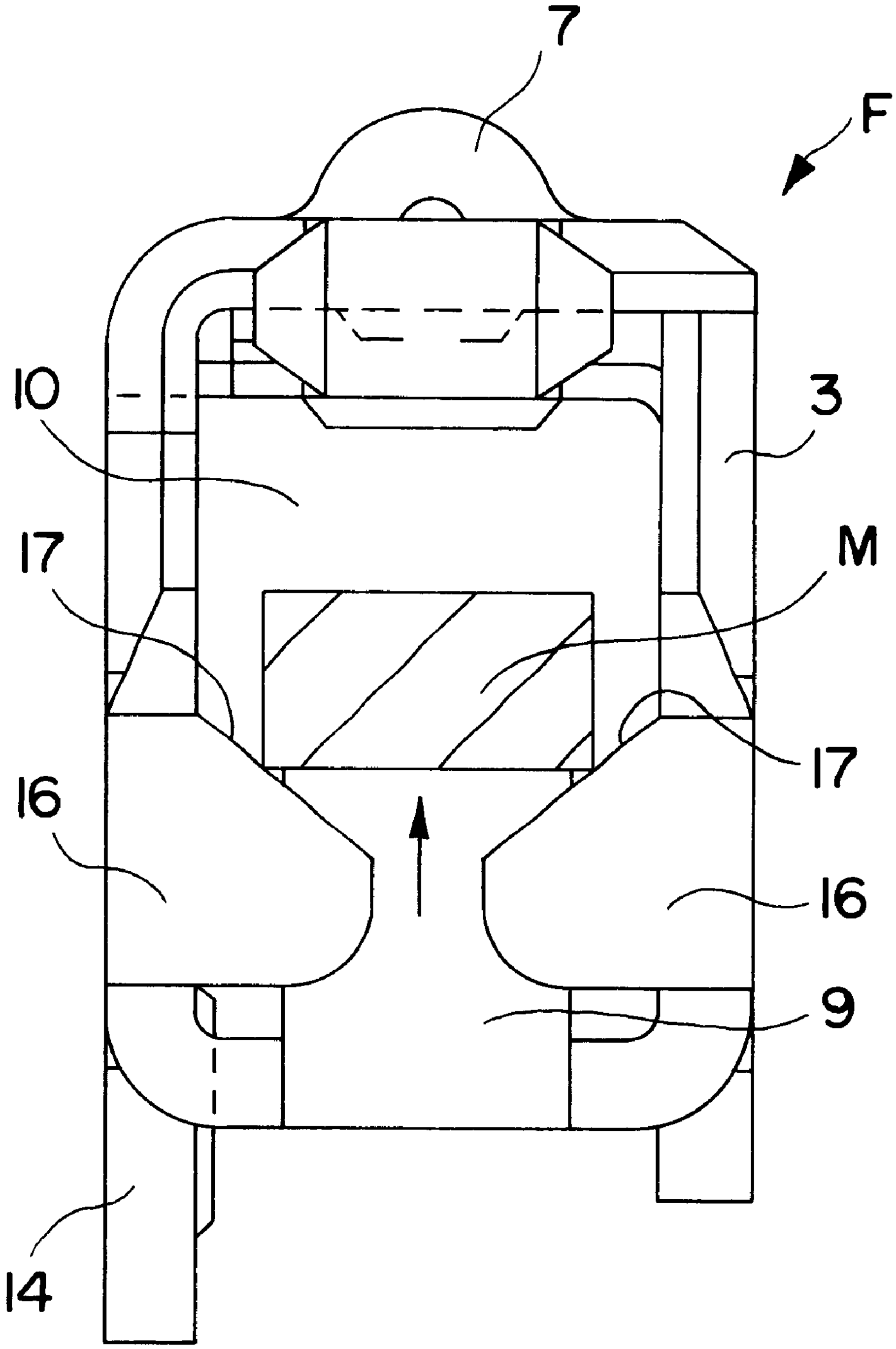
FIG. 5 is a front view showing how a male terminal fitting is guided.
Figure 6:
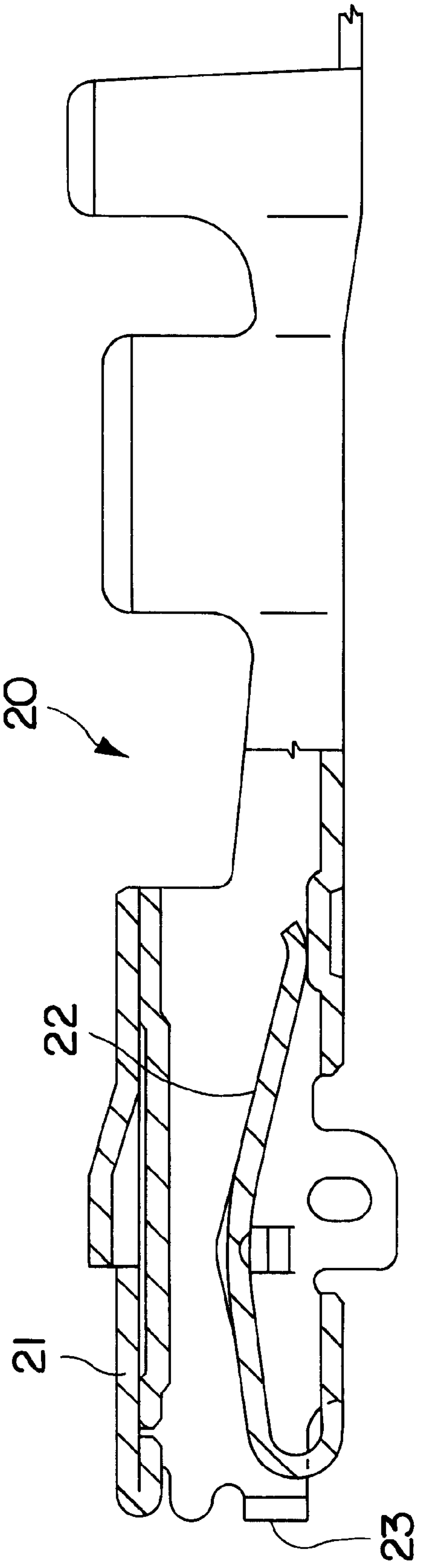
FIG. 6 PRIOR ART
FIG. 6 is a side view in section of a prior art female terminal fitting.
Figure 7:
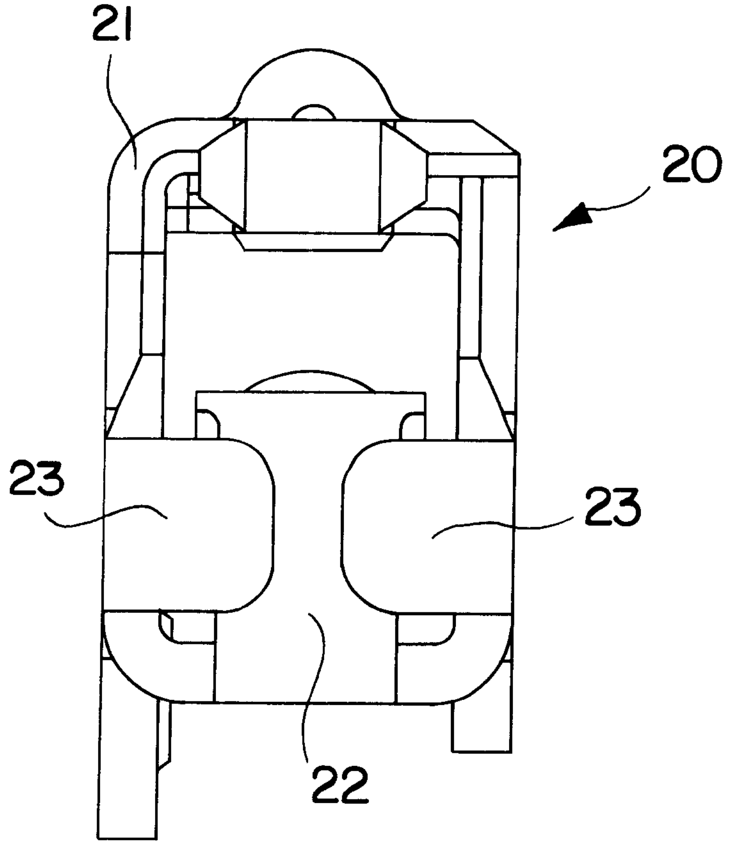
FIG. 7 PRIOR ART
FIG. 7 is a front view of the prior art female terminal fitting.

The left and right sides of the opening edge of the connecting portion 3 are bent inward or toward the tab insertion space 10 at an angle different from 0° or 180°, preferably substantially at right angles to form a pair of protection walls 16. The protection walls 16 are opposed to each other at a specified spacing to protect the tongue 9. The protection walls 16 are spaced away from the turned portion of the tongue 9, and the upper ends are located below the tab insertion space 10, so that the leading end of the male terminal fitting M can enter the tab insertion space 10 after passing above the protection walls 16 when the male terminal fitting is inserted into the female terminal fitting F at a proper height. However, if the leading end of the male terminal fitting M is inserted obliquely downward, it is guided into the tab insertion space 10 by guide surfaces 17 of the protection walls 16. More specifically, the guide surfaces 17 are formed at the upper ends of the protection walls 16 in such a manner that the spacing between the protection walls 16 is widened upwardly or toward the tab insertion space 10. On the other hand, the leading end of the male terminal fitting M includes the tapered guide portion MT, as shown in FIG. 3. Accordingly, if the male terminal fitting M is not properly inserted into the female terminal fitting F due to a displacement of its central axis, the opposite lateral edges of the guide portion MT slide at least partly in contact with the guide surfaces 17 as the main terminal fitting M is inserted as shown in FIG. 5, and the guide portion MT is gradually guided upward, i.e. into the tab insertion space 10.

The female terminal fitting F is accommodated in the cavity 5 of the female connector housing 4 and the male terminal fitting M is accommodated in the male connector housing. The male and female connector housings then are connected. At this time, if the center axis of the male terminal fitting M is not displaced with respect to the female terminal fitting F, the male terminal fitting M passes through the terminal receiving opening 6 of the connector housing 4, and enters the connecting portion 3 straight after passing above the protection walls 16. Once in the connecting portion 3, the male terminal fitting M enters the tab insertion space 10 and elastically deforms the tongue 9. When the male and female terminal fittings 4 are properly connected, the female terminal fitting M is held in an electrically conductive state while being tightly held substantially between the contact portion 9A and the ceiling surface of the cavity 5.

Figure 4:
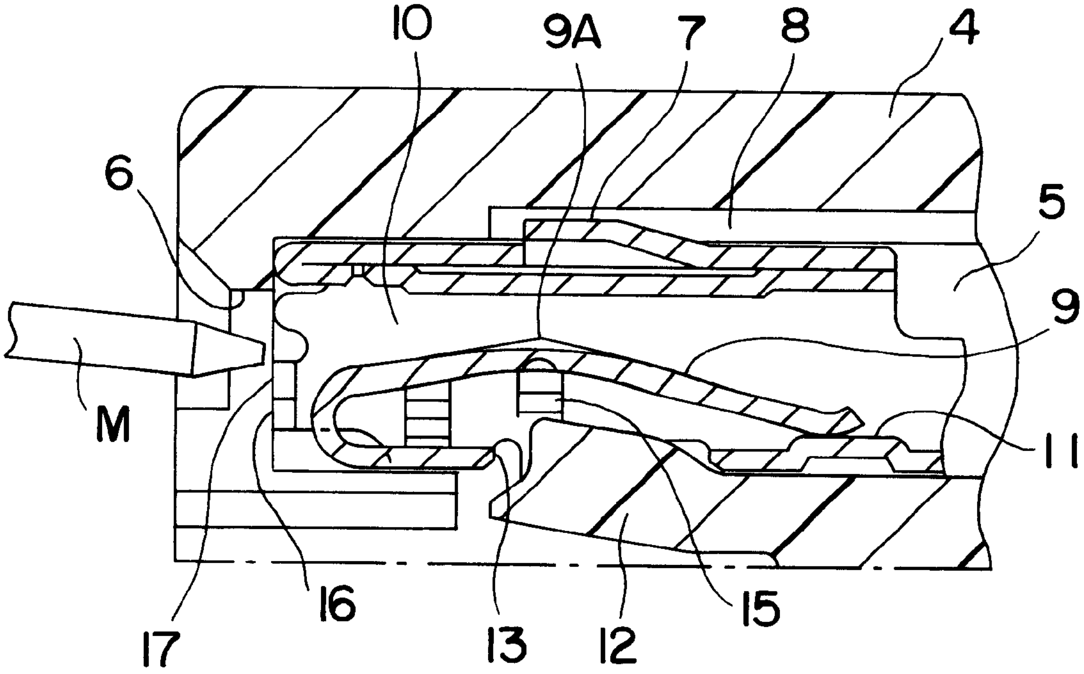
FIG. 4 is a side view of the female terminal fitting when being accommodated in the connector housing.

On the other hand, even if the male terminal fitting M enters obliquely downward as shown in FIG. 4 due to a displacement of its center axis with respect to the female terminal fitting F, it does not strike against the protection walls 16 since the protection walls 16 have their upper center portions cut off by forming the guide surfaces 17. The guide portion MT of the male terminal fitting M advances toward the spacing between the protection walls 16 and its side ends come into contact with the guide surfaces 17. As the male terminal fitting M further advances, the guide portion MT slides along the inclination of the guide surfaces 17. As a result, the male: terminal fitting M is oriented upward or toward the tab insertion space 10, and is guided into the tab insertion space 10. Accordingly, the displacement of the center axis of the male terminal fitting M is corrected automatically, and the male and female terminal fittings are properly electrically connected.

As described above, the interference of the male terminal fitting M with the tongue 9 can be avoided even if the center axis of the male terminal fitting M is displaced, and the displacement of the center axis of the male terminal fitting M is corrected by the guide surfaces 17 of the protection walls 16. Thus, the male and female terminal fittings can be connected properly with each other. Even if an object other than the male terminal fitting M is inserted into the female terminal fitting F, the tongue 9 comes into engagement with the stoppers 15 to prevent an excessive deformation. In this embodiment, since the vertical movement of the male terminal fitting M also is restricted at the entrance of the connecting portion 3 by the protection walls 16, the deformation of the tongue 9 can be suppressed to a minimum level. Although the protection walls 16 have their upper portions cut off to form the guide surfaces 17, an area necessary to insert an engagement detection probe is ensured. Further, since the protection walls 16 have the same width as the prior art protection walls, they have a sufficient strength against a pressing force of the probe.

A variety of changes can be made in the present invention. For example, the following modifications are also embraced by the technical scope of the present invention as defined in the claims.

Although one pair of protection walls 16 are provided in the foregoing embodiment, only one protection wall may project from one side and a V-shaped guide surface 17 may be formed in a position corresponding to the tongue portion 9. Although two means, i.e. the projection 7 and the stabilizer 14 are provided to prevent an upside-down insertion in the foregoing embodiment, only one of them may be provided.

What is claimed is:

1. A female terminal fitting having a front end, a connecting portion extending rearwardly from the front end, the connecting portion being in the form of a substantially rectangular tube having opposed spaced apart top and bottom walls and opposed spaced apart first and second side walls connected to and extending between the top and bottom walls, the connecting portion being dimensioned for receiving a male terminal fitting, a tongue being formed on the bottom wall of the connecting portion for elastic contact with a tab of the male terminal fitting, at least a first protection wall projecting from said first side wall of the connecting portion and extending substantially toward the second side wall of the connecting portion, and disposed forwardly of the tongue, at least one guide surface being formed on the protection wall for sliding contact with the male terminal fitting, the guide surface being tapered with respect to its widthwise direction such that the guide surface is closest to the top wall of the connecting portion at locations adjacent the first side wall and is spaced further from the top wall of the connecting portion at locations closer to the second side wall so as to guide the male terminal fitting to a proper contact position with the tongue.

2. A female terminal fitting according claim 1, wherein the tongue is formed by being elastically deformed and turned into the connecting portion.

3. A female terminal fitting according to claim 2, wherein the protection wall substantially covers the turned portion of the tongue.

4. A female terminal fitting according to claim 1, wherein the female terminal fitting is unitarily formed by bending an electrically conductive metal plate.

5. A female terminal fitting according to claim 1, further comprising at least one stopper formed in at least one said side wall of the connecting portion, the stopper being located between the bottom wall of the connecting portion and a contact portion of the tongue with the male terminal fitting.

6. A female terminal fitting according to claim 1, wherein the female terminal fitting further comprises a second protection wall projecting from the second side wall of the connecting portion toward the first side wall thereof, the second protection wall having a guide surface tapered with respect to its widthwise direction so that the guide surface of the second protection wall is closest to the top wall at locations adjacent the second side wall and is spaced further from the top wall at locations further from the second side wall.

* * * * *

UNITED STATES PATENT AND TRADEMARK OFFICE

CERTIFICATE OF CORRECTION

PATENT NO. : 6,227,915 B1
DATED : May 8, 2001
INVENTOR(S) : Atshushi Sakatani et al.

It is certified that error appears in the above-identified patent and that said Letters Patent is hereby corrected as shown below:

Title page,
Item [75], Inventors, should read:
-- Atsushi Sakatani, Yokkaichi-City, Japan
Shinya Fujita, Yokkaichi-City, Japan
Yasumitsu Makita, Yokkaichi-City, Japan
Yukihiro Fukatsu, Yokkaichi-City, Japan --

Signed and Sealed this

Fifth Day of October, 2004

JON W. DUDAS
*Director of the United States Patent and Trademark Office*